(12) United States Patent
Liu

(10) Patent No.: US 12,364,053 B2
(45) Date of Patent: Jul. 15, 2025

(54) SOLAR CELL AND METHOD FOR MANUFACTURING SOLAR CELL, AND PHOTOVOLTAIC MODULE

(71) Applicant: ZHEJIANG JINKO SOLAR CO., LTD., Zhejiang (CN)

(72) Inventor: Changming Liu, Zhejiang (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/125,291

(22) Filed: Mar. 23, 2023

(65) Prior Publication Data
US 2024/0266447 A1    Aug. 8, 2024

(30) Foreign Application Priority Data
Feb. 8, 2023   (CN) ......................... 202310119980.6

(51) Int. Cl.
H10F 77/30   (2025.01)
H10F 71/00   (2025.01)
H10F 77/20   (2025.01)
H10F 77/70   (2025.01)

(52) U.S. Cl.
CPC ......... *H10F 77/311* (2025.01); *H10F 71/129* (2025.01); *H10F 71/1221* (2025.01); *H10F 71/128* (2025.01); *H10F 77/215* (2025.01); *H10F 77/703* (2025.01)

(58) Field of Classification Search
CPC ....... H01L 31/022433; H01L 31/02167; H01L 31/02168; H10F 77/311; H10F 71/129
See application file for complete search history.

(56) References Cited

U.S. PATENT DOCUMENTS

2008/0308151 A1*  12/2008  Den Boer ........... H01L 31/1884
                                                          136/256
2010/0108138 A1*  5/2010  Smith .............. H01L 31/02167
                                                          438/57
(Continued)

FOREIGN PATENT DOCUMENTS

CN        104335357 A     2/2015
CN        205657066 U    10/2016
(Continued)

OTHER PUBLICATIONS

Office Action issued in corresponding JP Application 2023065822, issued Oct. 31, 2023, and an English Translation, 10 pages.
(Continued)

*Primary Examiner* — Lindsey A Buck
(74) *Attorney, Agent, or Firm* — Burris Law, PLLC

(57) ABSTRACT

A solar cell, a method for manufacturing solar cell, and a photovoltaic module. The solar cell includes: a semiconductor substrate; a tunneling layer located over a rear surface of the semiconductor substrate; a hydrogen barrier layer located over a surface of the tunneling layer; a lightly doped conductive layer located over a surface of the hydrogen barrier layer; and grid-shaped doped conductive layers located on at least part of a surface of the lightly doped conductive layer, wherein each of the grid-shaped doped conductive layers includes a heavily doped conductive layer and a metal barrier layer that are stacked on one another.

20 Claims, 4 Drawing Sheets

(56) References Cited

U.S. PATENT DOCUMENTS

| | | | | |
|---|---|---|---|---|
| 2016/0172522 | A1* | 6/2016 | Sameshima | H01L 31/043 438/74 |
| 2017/0018677 | A1* | 1/2017 | Le Perchec | H01L 31/068 |
| 2019/0157474 | A1 | 5/2019 | Nam et al. | |
| 2022/0029040 | A1* | 1/2022 | Yin | H01L 31/022425 |
| 2022/0262967 | A1 | 8/2022 | Kim et al. | |

FOREIGN PATENT DOCUMENTS

| | | | |
|---|---|---|---|
| CN | 110634996 | A | 12/2019 |
| CN | 210897294 | U | 6/2020 |
| CN | 112349798 | A | 2/2021 |
| CN | 112736159 | A | 4/2021 |
| CN | 113314630 | A | 8/2021 |
| CN | 113629155 | A | 11/2021 |
| CN | 217522019 | U | 9/2022 |
| CN | 115224159 | A | 10/2022 |
| EP | 3321977 | A1 | 5/2018 |
| JP | 2022073810 | A | 5/2022 |
| JP | 2022081367 | A | 5/2022 |
| KR | 1020160097922 | A | 8/2016 |
| KR | 1020170089675 | A | 8/2017 |

OTHER PUBLICATIONS

Office Action issued in corresponding AU Application 2023201860, issued Jan. 17, 2024, 6 pages.
Chinese Office Action issued in corresponding CN Application 202310119980.6, issued Mar. 13, 2024, and an English Translation, 16 pages.
Extended European Search Report issued in corresponding EP Application 23164626.6, issued Sep. 15, 2023, 7 pages.

\* cited by examiner

SOLAR CELL AND METHOD FOR MANUFACTURING SOLAR CELL, AND PHOTOVOLTAIC MODULE

CROSS-REFERENCE TO RELATED APPLICATION

This application claims priority to and the benefit of Chinese Patent Application No. 202310119980.6 filed on Feb. 8, 2023. The disclosure of the above application is incorporated herein by reference.

FIELD

The present disclosure relates to the technical field of solar cells and, in particular, to a solar cell and a method for manufacturing solar cell, and a photovoltaic module.

BACKGROUND

The statements in this section merely provide background information related to the present disclosure and may not constitute prior art.

A TOPCon cell refers to a tunnel oxide passivation contact cell. Its core design lies in an ultra-thin tunnel oxide layer and a heavily doped polycrystalline silicon layer on the back surface. The ultra-thin oxide layer may cause electrons to tunnel into the polycrystalline silicon layer and block transport of holes, which reduces the recombination rate and improves the passivation effect and the conversion efficiency of the cell. Heavily doped polycrystalline silicon has certain parasitic light absorption, and the thicker polycrystalline silicon layer on the back surface leads to reduction in the short-circuit current of the cell.

At present, metal electrodes in photovoltaic cells are generally manufactured by screen printing. After metallization paste is sintered at a high temperature, silver in a finger configured for an ohmic contact effect erodes polycrystalline silicon to a depth of about 30 nm. Although thickening the overall polycrystalline silicon layer improves passivation loss of the doped polycrystalline silicon layer caused by metallization process, high-concentration doped polycrystalline silicon leads to parasitic light absorption. In addition, a higher-temperature sintering step adopted in screen printing metallization process may reduce quality of passivation of a phosphorus-doped polycrystalline silicon structure in passivation and contact regions, thereby reducing the passivation effect, resulting in a reduction in photoelectric conversion efficiency.

SUMMARY

This section provides a general summary of the disclosure and is not a comprehensive disclosure of its full scope or all of its features.

In view of this, the present disclosure proposes a solar cell, a method for manufacturing solar cell, and a photovoltaic module, which can improve photoelectric conversion efficiency of the solar cell.

In a first aspect, the present disclosure provides a solar cell, including: a semiconductor substrate; a tunneling layer located over a rear surface of the semiconductor substrate; a hydrogen barrier layer located over a surface of the tunneling layer; a lightly doped conductive layer located over a surface of the hydrogen barrier layer; and grid-shaped doped conductive layers located on at least part of a surface of the lightly doped conductive layer, wherein each of the grid-shaped doped conductive layers includes a heavily doped conductive layer and a metal barrier layer that are stacked on one another.

In one or more embodiments, the grid-shaped doped conductive layer further includes a third doped conductive layer located at a surface of the metal barrier layer.

In one or more embodiments, the hydrogen barrier layer includes at least one of a silicon oxynitride layer, a hafnium oxide layer, or a tantalum oxide layer.

In one or more embodiments, the hydrogen barrier layer has a thickness ranging from 0.2 nm to 1 nm.

In one or more embodiments, the hydrogen barrier layer has a dielectric constant ranging from 4.0 to 28.

In one or more embodiments, the hydrogen barrier layer has a refractive index ranging from 1.6 to 2.6.

In one or more embodiments, the metal barrier layer comprises at least one of M nitride, M oxide, M carbide, M oxynitride, M metal, silicon carbide, and silicon nitride, wherein M is selected from at least one of Ti, Al, Ta, Cr, Ca, Mo, V, Zr, or W.

In one or more embodiments, the metal barrier layer comprises at least one of a tantalum nitride layer, a titanium nitride layer, a titanium carbide layer, a tungsten carbide layer, a titanium aluminum oxide layer, or a silicon carbide layer.

In one or more embodiments, the metal barrier layer is a laminated structure of a titanium aluminum oxide layer and a titanium oxide layer.

In one or more embodiments, the metal barrier layer has a thickness ranging from 0.5 nm to 5 nm.

In one or more embodiments, the metal barrier layer has a resistivity less than 1.5 mΩ·cm.

In one or more embodiments, the lightly doped conductive layer has a doping concentration ranging from 0.8 E20 $cm^{-3}$ to 4 E20 $cm^{-3}$, and the heavily doped conductive layer has a doping concentration ranging from 4 E20 $cm^{-3}$ to 2 E21 $cm^{-3}$.

In one or more embodiments, the heavily doped conductive layer has an optical band gap ranging from 1.4 eV to 1.8 eV, and/or the lightly doped conductive layer and the heavily doped conductive layer each have a degree of crystallization after annealing being greater than 70%.

In one or more embodiments, the degree of crystallization of the lightly doped conductive layer is greater than 88%, and the degree of crystallization of the heavily doped conductive layer is greater than 80%.

In one or more embodiments, the grid-shaped doped conductive layer has a width ranging from 70 μm to 110 μm, and the grid-shaped doped conductive layer has a total thickness ranging from 20 nm to 50 nm.

In one or more embodiments, the solar cell further includes first passivation layers located between the grid-shaped doped conductive layers, and first electrodes configured to form ohmic contact with at least part of the grid-shaped doped conductive layers.

In one or more embodiments, the solar cell further includes first passivation layers located between the grid-shaped doped conductive layers and also on surfaces of the grid-shaped doped conductive layers, and first electrodes penetrating the first passivation layers to form ohmic contact with at least part of the grid-shaped doped conductive layers.

In a second aspect, the present disclosure provides a method for manufacturing solar cell, the method includes the following steps: texturing a semiconductor substrate; forming a tunneling layer over a rear surface of the semiconductor substrate; depositing a hydrogen barrier layer over a surface of the tunneling layer; depositing a first polycrystalline silicon layer over a surface of the hydrogen barrier layer; forming a mask over a surface of the first polycrystalline silicon layer, depositing a grid-shaped second polycrystalline silicon layer at a region not covered by the mask and simultaneously performing in-situ doping to form a second doped conductive layer, and depositing a metal barrier layer over a surface of the second doped conductive layer; and performing secondary doping at the first polycrystalline silicon layer and the second doped conductive layer to obtain a lightly doped conductive layer and a heavily doped conductive layer.

In a third aspect, the present disclosure provides a photovoltaic module, wherein the photovoltaic module includes a plurality of solar cell strings, the solar cell strings each include a plurality of solar cells described in the first aspect above.

Further areas of applicability will become apparent from the description provided herein. It should be understood that the description and specific examples are intended for purposes of illustration only and are not intended to limit the scope of the present disclosure.

DRAWINGS

In order to better illustrate the technical solutions in the embodiments of the present disclosure or the related art, the accompanying drawings used in the description of the embodiments or the related art will be introduced below. It is apparent that, the accompanying drawings in the following description are only some embodiments of the present disclosure, and other drawings can be obtained by those of ordinary skill in the art from the provided drawings without creative efforts.

Figure 1:
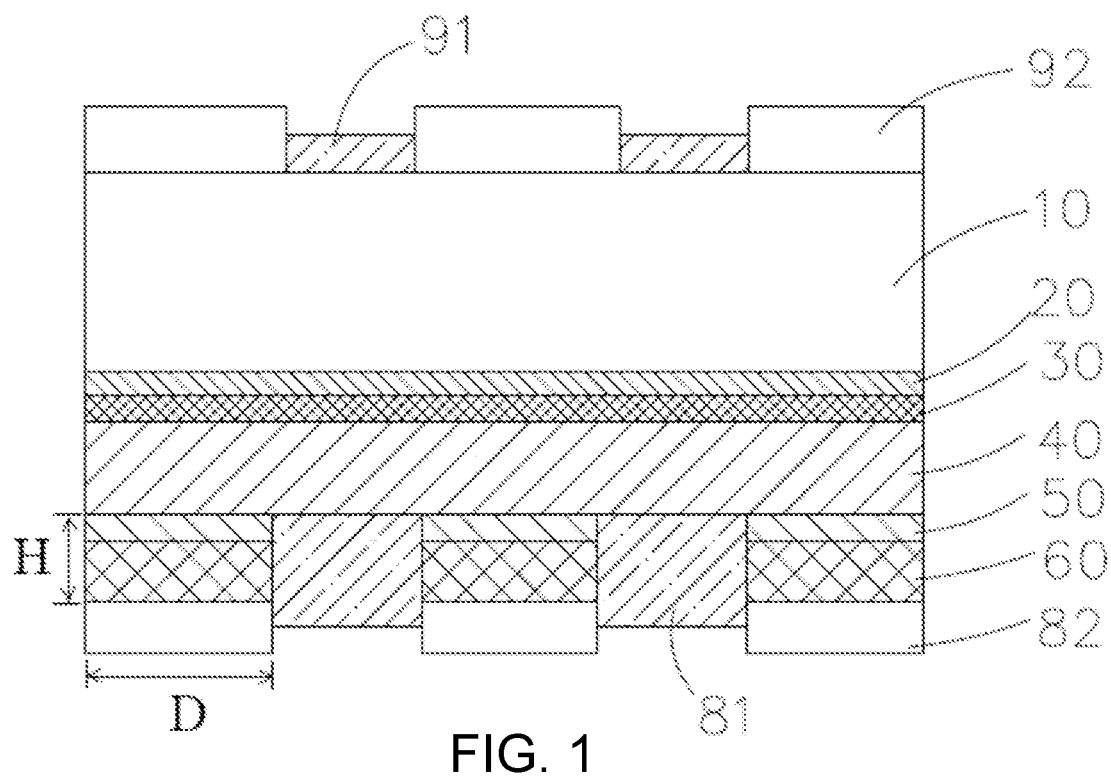
FIG. 1 is a schematic structural diagram of a solar cell according to some embodiments of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solutions of the present disclosure, the embodiments of the present disclosure will be described in detail below with reference to the accompanying drawings.

It should be made clear that the described embodiments are merely some of rather than all of the embodiments of the present disclosure. All other embodiments acquired by those of ordinary skill in the art without creative efforts based on the embodiments in the present disclosure fall within the protection scope of the present disclosure.

The terms used in the embodiments of the present disclosure are for the purpose of describing particular embodiments only, and are not intended to limit the present disclosure. As used in the embodiments of the present disclosure and the appended claims, the singular forms of "a/an", "the", and "said" are intended to include plural forms, unless otherwise clearly specified in the context.

It should be understood that the term "and/or" used herein is merely an association relationship describing associated objects, indicating that three may be three kinds of relationships. For example, A and/or B indicates that there are three cases of A alone, A and B together, and B alone. In addition, the character "/" herein generally means that associated objects before and after it are in an "or" relationship.

The full name of a TOPCon cell is a tunnel oxide passivation contact cell, its core concept is an ultra-thin tunnel oxide layer and a heavily doped polycrystalline silicon layer on the back side. The ultra-thin oxide layer may cause electrons to tunnel into the polycrystalline silicon layer and simultaneously block transport of holes, which reduces the recombination rate and improves the passivation effect and the conversion efficiency of the solar cell. Heavily doped polycrystalline silicon has certain parasitic light absorption, and the thicker polycrystalline silicon layer on the back leads to reduction in short-circuit current of the solar cell.

High-temperature sintering of the metallization paste commonly used in screen printing at present causes silver to erode polycrystalline silicon at a depth of about 30 nm. However, a thicker overall polycrystalline silicon layer or high-concentration doped polycrystalline silicon leads to parasitic light absorption. In addition, a high-temperature sintering step used in the screen printing metallization process may reduce quality of passivation of a phosphorus-doped polycrystalline silicon structure in passivation and contact regions, thereby reducing the passivation effect, resulting in reduction in photoelectric conversion efficiency.

Based on this, in a first aspect, the present disclosure provides a solar cell. As shown in FIG. 1, the solar cell includes: a semiconductor substrate 10; a tunneling layer 20 located on a rear surface of the semiconductor substrate; a hydrogen barrier layer 30 located on a surface of the tunneling layer 20; a lightly doped conductive layer 40 located on a surface of the hydrogen barrier layer 30; and grid-shaped doped conductive layers located on at least part of a surface of the lightly doped conductive layer 40. The grid-shaped doped conductive layers each include a heavily doped conductive layer 50 and a metal barrier layer 60 that are stacked on one another.

In the above solution, fill factor efficiency of the solar cell can be improved by forming a selective passivation contact structure on the rear surface of the solar cell, and the hydrogen barrier layer is arranged between the tunneling layer and the lightly doped conductive layer to use the hydrogen barrier layer to prevent overflow of hydrogen during annealing, which increases hydrogen concentration at the interface of the tunneling layer after annealing and improves the passivation effect. The heavily doped conductive layer and the metal barrier layer that are stacked are constructed on the grid-shaped doped conductive layer, and the metal barrier layer can prevent erosion of the heavily doped conductive layer by metal electrodes and can also reduce the thickness of a passivated polycrystalline silicon layer of the entire solar cell, enhancing light absorption of the solar cell. Therefore, under the synergistic effect of the selective passivation contact structure, the hydrogen barrier layer, and the metal barrier layer, the solar cell can improve conversion efficiency compared with conventional TOPCon cells.

A front surface of the semiconductor substrate 10 may refer to a light-receiving surface, that is, a (light-receiving) surface that receives sunlight irradiation, and a rear surface of the semiconductor substrate 10 refers to a surface opposite to the front surface. In some embodiments, the formed solar cell is a single-sided solar cell, the front surface may refer to the light-receiving surface, and the rear surface may refer to a backlight surface. In some embodiments, the formed solar cell is a double-sided solar cell, and both the front surface and the rear surface may be light-receiving surfaces.

As an optional technical solution of the present disclosure, the semiconductor substrate 10 is an N-type crystalline silicon substrate (or silicon wafer), and a P-type doped layer may be formed on the front surface of the semiconductor substrate by using any one or more processes of high-temperature diffusion, paste doping, and ion implantation, so as to form a PN junction in the semiconductor substrate 10. In some embodiments, the semiconductor substrate 10 may be one of a monocrystalline silicon substrate, a polycrystalline silicon substrate, a microcrystalline silicon substrate, and a silicon carbide substrate.

In some embodiments, the P-type doped layer is a boron-doped diffusion layer. The boron-doped diffusion layer is a P-type doped layer (that is, a P+ layer) formed by using a boron source to diffuse boron atoms to a certain depth on the front surface through a diffusion process. For example, the boron source may be liquid boron tribromide.

In some embodiments, the front surface of the semiconductor substrate 10 has a textured structure, and the textured structure may be formed by performing a texturing process on the semiconductor substrate. The texturing process may be performed by chemical etching, laser etching, a mechanical method, plasma etching, or the like. The textured structure enables better filling in the textured structure when metal paste is screen-printed to form electrodes, thereby obtaining better electrode contact, which can effectively reduce series resistance of the solar cell and increase the fill factor.

As shown in FIG. 1, the tunneling layer 20 is located on the rear surface of the semiconductor substrate 10, the tunneling layer 20 may be a stacked structure of one or more of a silicon oxide layer, an aluminum oxide layer, a silicon oxynitride layer, a molybdenum oxide layer, and a hafnium oxide layer. In other embodiments, the tunneling layer 20 may also be an oxygen-containing silicon nitride layer, an oxygen-containing silicon carbide layer, or the like.

A thickness of the tunneling layer 20 ranges from 0.8 nm to 2.5 nm. For example, the thickness of the tunneling layer 20 may be 0.8 nm, 0.9 nm, 1.0 nm, 1.2 nm, 1.4 nm, 1.6 nm, 1.8 nm, 2 nm, 2.5 nm, or the like. The thickness of the tunneling layer 20 refers to a thickness of the tunneling layer relative to a surface from which it is formed. If the thickness of the tunneling layer 20 is extremely large, it is not conducive to reducing contact resistance of the tunneling layer. By controlling the thickness of the tunneling layer, the reduction in the fill factor caused by the contact resistance can be suppressed. When the thickness of the tunneling layer is extremely large, the tunneling effect of majority carriers is affected, it is difficult for the carriers to pass through the tunneling layer 20, and photoelectric conversion efficiency of the solar cell may gradually decrease. When the thickness of the tunneling layer 20 is extremely small, the passivation effect cannot be achieved. In some embodiments, the tunneling layer 20 is a silicon oxide layer, and the thickness of the tunneling layer 20 ranges from 0.6 nm to 1.6 nm.

In some embodiments, as shown in FIG. 1, the hydrogen barrier layer 30 is provided on an entire surface of the tunneling layer 20 away from the semiconductor substrate 10.

In some embodiments, the hydrogen barrier layer 30 is made of an oxide with a high dielectric constant. For example, the hydrogen barrier layer 30 includes at least one of a silicon oxynitride layer, a hafnium oxide layer, and a tantalum oxide layer. Since the hydrogen barrier layer has a high dielectric constant, positive charge density thereof is higher than that of the material of the tunneling layer. After sintering and annealing, most of the hydrogen enters the semiconductor substrate, or diffuses to a surface of the tunneling layer away from the semiconductor substrate. Through the arrangement of the hydrogen barrier layer 30, overflow of hydrogen to the lightly doped conductive layer during the annealing can be prevented, outward diffusion of the hydrogen is prevented, hydrogen concentration at the interface of the tunneling layer after annealing is increased, and thus the passivation effect is improved.

A thickness of the hydrogen barrier layer 30 ranges from 0.2 nm to 1 nm. For example, the thickness of the hydrogen barrier layer 30 may be 0.2 nm, 0.3 nm, 0.35 nm, 0.4 nm, 0.5 nm, 0.7 nm, 0.9 nm, 1.0 nm, or the like, which may also be other values in the above range. The thickness is controlled within the above range, which can meet the effect of preventing diffusion of the hydrogen without affecting the tunneling of the electrons.

A dielectric constant of the hydrogen barrier layer 30 ranges from 4.0 to 28. For example, the dielectric constant of the hydrogen barrier layer 30 may be 4.0, 5, 6, 6.5, 7, 9, 10, 25, or the like, which may also be other values in the above range. When the dielectric constant is extremely high, insulation conductivity of the hydrogen barrier layer 30 deteriorates.

A refractive index of the hydrogen barrier layer 30 ranges from 1.6 to 2.6. For example, the refractive index of the hydrogen barrier layer 30 is 1.6, 1.8, 1.9, 2.1, 2.2, 2.4, 2.6, or the like, which may also be other values in the above range.

In some embodiments, the lightly doped conductive layer 40 is located on a surface of the hydrogen barrier layer 30 away from the semiconductor substrate 10.

In some embodiments, the lightly doped conductive layer 40 and the semiconductor substrate 10 have doping elements of a same conductivity type. When the semiconductor substrate 10 is an N-type monocrystalline silicon substrate, the lightly doped conductive layer 40 is an N-type doped polycrystalline silicon layer, an N-type doped microcrystalline silicon layer, or an N-type doped silicon carbide layer, and the doping elements may be N-type doping elements such as phosphorus.

As shown in FIG. 1, a doping concentration of the lightly doped conductive layer 40 ranges from 0.8 E20 $cm^{-3}$ to 4 E20 $cm^{-3}$, which may be, for example, 0.8 E20 $cm^{-3}$, 1.0 E20 $cm^{-3}$, 1.2 E20 $cm^{-3}$, 1.5 E20 $cm^{-3}$, 1.8 E20 $cm^{-3}$, 2.0 E20 $cm^{-3}$, 2.5 E20 $cm^{-3}$, 3.0 E20 $cm^{-3}$, 3.9 E20 $cm^{-3}$, or the like, and may also be other values in the above range.

A thickness of the lightly doped conductive layer 40 ranges from 40 nm to 110 nm. For example, the lightly doped conductive layer 40 is an N-type doped polycrystalline silicon layer, and a refractive index of the doped conductive layer 40 is in a range of 3.5 to 4.5.

Further, the grid-shaped doped conductive layer is located on at least part of a surface of the lightly doped conductive layer 40. That is, the grid-shaped doped conductive layer corresponds to a metal electrode region, and the grid-shaped doped conductive layer includes a heavily doped conductive layer 50 and a metal barrier layer 60 that are stacked on one another.

In some embodiments, doping concentration of the heavily doped conductive layer 50 ranges from 4 E20 cm$^{-3}$ to 12 E20 cm$^{-3}$, which may be, for example, 4 E20 cm$^{-3}$, 5 E20 cm$^{-3}$, 6 E20 cm$^{-3}$, 7 E20 cm$^{-3}$, 8 E20 cm$^{-3}$, 9 E20 cm$^{-3}$, 10 E20 cm$^{-3}$, 11 E20 cm$^{-3}$, 12 E20 cm$^{-3}$, or the like, and may also be other values in the above range. The thickness of the heavily doped conductive layer 50 is larger, an open-circuit voltage of the solar cell can be increased, and when the thickness is smaller, it is beneficial to reduce parasitic light absorption and increase the short-circuit current of the solar cell, and increasing local doping concentration of the heavily doped conductive layer 50 can increase the fill factor and the open-circuit voltage of the solar cell.

A band gap of the heavily doped conductive layer 50 ranges from 1.4 eV to 1.8 eV, which may be, for example, 1.4 eV, 1.5 eV, 1.6 eV, 1.65 eV, 1.7 eV, 1.8 eV, or the like, and may also be other values in the above range.

In some embodiments, degrees of crystallization of the lightly doped conductive layer 40 and the heavily doped conductive layer 50 are greater than 70%. A high degree of crystallization means few defects in crystal in the conductive layer and good photoelectric properties, which can improve the photoelectric conversion efficiency of the solar cell.

Further, the metal barrier layer 60 is located on a surface of the heavily doped conductive layer 50 away from the semiconductor substrate. It may be understood that, when the solar cell is metallized to form electrodes, it easily causes local damages or erosion to the heavily doped conductive layer. The greater the depth of the erosion, the lower the open-circuit voltage of the solar cell. Moreover, an extremely thick heavily doped conductive layer may bring parasitic light absorption, resulting in decrease in the short-circuit current and decrease in a bifacial rate of the solar cell. Through the arrangement of the metal barrier layer, intrusion of the metal electrodes into the heavily doped conductive layer can be prevented, and the thickness of the entire solar cell can be reduced, thereby enhancing the photoelectric conversion efficiency.

In some embodiments, the metal barrier layer 60 is made of a material with a high melting point and no negative charge. The metal barrier layer 60 includes at least one of M nitride, M oxide, M carbide, M oxynitride, M metal, silicon carbide, and silicon nitride. M is selected from at least one of Ti, Al, Ta, Cr, Ca, Mo, V, Zr, and W.

For example, the metal barrier layer includes at least one of a tantalum nitride layer, a titanium nitride layer, a titanium carbide layer, a tungsten carbide layer, and a silicon carbide layer. In an example, tantalum nitride has a melting point of 3090° C. and resistivity of 128 μΩ·cm; titanium nitride has a melting point of 2950° C. and resistivity of 22 μΩ·cm; titanium carbide has a melting point of 3140° C. and resistivity of 60 μΩ·cm. In consideration of convenience of the manufacturing process and manufacturing costs, in some embodiments, the metal barrier layer is a silicon carbide layer, and a mass content of carbon in silicon carbide is less than 20%.

In some embodiments, the metal barrier layer 60 is a laminated structure of a titanium aluminum oxide layer and a titanium oxide layer. The laminated structure can have low manufacturing costs and ensure an anti-erosion effect of the metal barrier layer.

In some embodiments, a thickness of the metal barrier layer 60 ranges from 0.5 nm to 5 nm, which may be, for example, 0.5 nm, 0.7 nm, 0.9 nm, 1 nm, 2 nm, 3 nm, 4 nm, 5 nm, or the like, and may also be other values in the above range.

In some embodiments, resistivity of the metal barrier layer 60 is less than 1.5 mΩ·cm, which may be, for example, 1.45 mΩ·cm, 1.3 mΩ·cm, 1.25 mΩ·cm, 1.15 mΩ·cm, 1.1 mΩ·cm, 1.0 mΩ·cm, 0.8 mΩ·cm, or the like, and may also be other values in the above range. That is, a conductivity of the metal barrier layer is better than the heavily doped conductive layer (heavily doped polycrystalline silicon layer), which can improve contact and increase the fill factor of the solar cell.

Further, in order to better protect the metal barrier layer 60, the grid-shaped doped conductive layer further includes a third doped conductive layer 70 located on a surface of the metal barrier layer. The third doped conductive layer 70 may be made of a same material as or a different material than the heavily doped conductive layer. For example, the third doped conductive layer 70 is an N-type doped polycrystalline silicon layer.

In some embodiments, doping concentration of the third doped conductive layer 70 is higher than the heavily doped conductive layer 50.

As shown in FIG. 1, a width D of the grid-shaped doped conductive layer ranges from 70 μm to 110 μm. The value of the width may be, for example, 70 μm, 75 μm, 80 μm, 85 μm, 90 μm, 95 μm, 100 μm, 110 μm, or the like, which may also be other values in the above range.

A total thickness H of the grid-shaped doped conductive layer ranges from 20 nm to 50 nm. The total thickness may be, for example, 20 nm, 25 nm, 30 nm, 35 nm, 40 nm, 45 nm, 50 nm, or the like, which may also be other values in the above range. Thicknesses of the heavily doped conductive layer 50 and the third doped conductive layer 7 are generally greater than 20 nm, and a specific thickness value of the heavily doped conductive layer 50 is not limited, only provided that the total thickness H of the grid-shaped doped conductive layer is controlled within the above range.

Further, the solar cell further includes first passivation layers 81 and first electrodes 82. The first passivation layers 81 are located between the grid-shaped doped conductive layers, and the first electrodes 82 form ohmic contact with at least part of the grid-shaped doped conductive layers. As shown in FIG. 1, the first electrodes 82 are located on surfaces of the metal barrier layers 60 to form ohmic contact. The first passivation layers 81 have thicknesses greater than the grid-shaped doped conductive layers, and form height differences with the first electrodes 82 on surfaces of the grid-shaped doped conductive layers.

Figure 2:
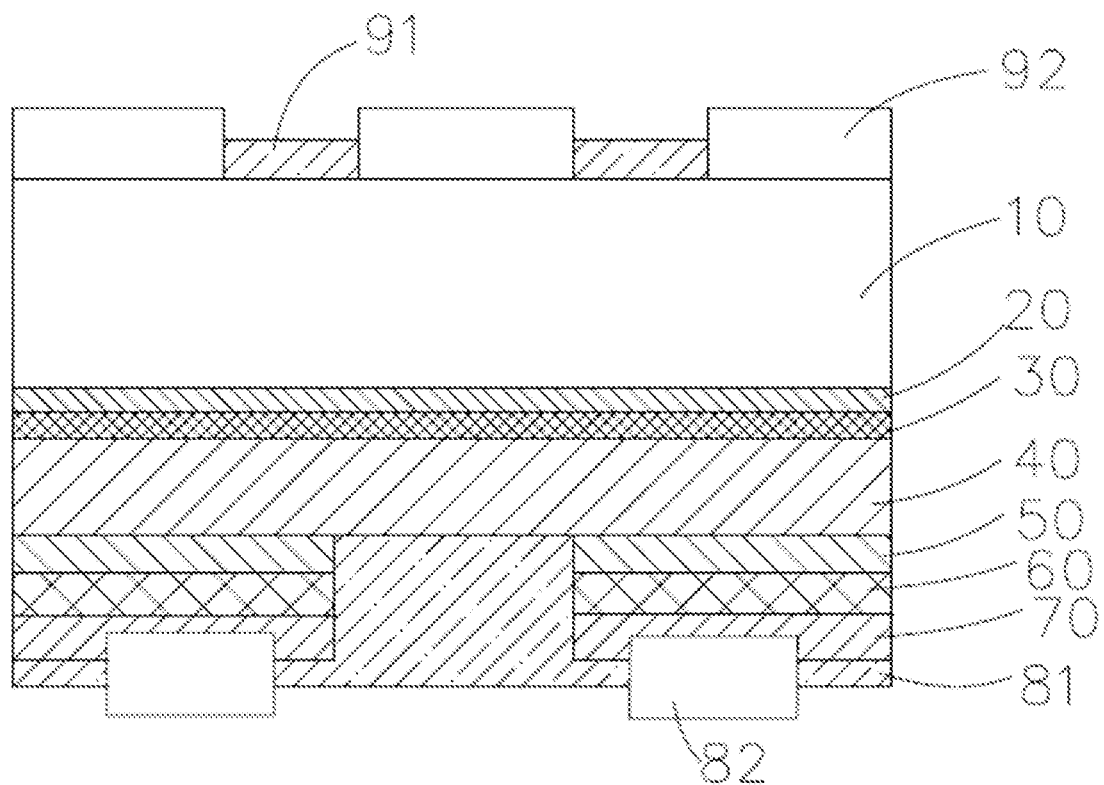
FIG. 2 is another schematic structural diagram of a solar cell according to some embodiments of the present disclosure.

In some embodiments, the first passivation layers 81 are located between the grid-shaped doped conductive layers and on surfaces of the grid-shaped doped conductive layers, and the first electrodes 82 penetrate the first passivation layers 81 to form ohmic contact with at least part of the grid-shaped doped conductive layers. As shown in FIG. 2, the first electrodes 82 penetrate the first passivation layers 81 to form ohmic contact with the third doped conductive layers 70.

In some embodiments, the first passivation layers 81 each include at least one of a silicon nitride layer, a silicon oxide layer, and a silicon oxynitride layer.

Still referring to FIG. 1, the solar cell 100 further includes second passivation layers 91 and second electrodes 92 that are located on a front surface of the semiconductor substrate 10.

In some embodiments, the second passivation layers 91 and the second electrodes 92 are alternately arranged on the front surface of the semiconductor substrate 10. The second passivation layers 91 each include a stacked structure of at least one or more of a silicon oxide layer, a silicon nitride layer, an aluminum oxide layer, and a silicon oxynitride layer.

In some embodiments, a thickness of the second passivation layer 91 ranges from 10 nm to 120 nm, may be, for example, 10 nm, 20 nm, 30 nm, 40 nm, 50 nm, 60 nm, 70 nm, 80 nm, 90 nm, 100 nm, 120 nm, or the like, and may also be other values in the above range, which is not limited herein.

In some embodiments, the second passivation layer 91 is a stacked passivation structure of an aluminum oxide layer and a silicon nitride layer. The aluminum oxide layer is arranged on the front surface of the semiconductor substrate 10, and the silicon nitride layer is arranged on a surface of the aluminum oxide layer.

The second electrodes 92 form ohmic contact with the P-type doped layer (e.g., the boron-doped diffusion layer) on the front surface of the semiconductor substrate 10, and the first electrodes 82 form ohmic contact with the grid-shaped doped conductive layers. The first electrodes 82 and the second electrodes 92 may be formed by coating and sintering of conductive metal paste. In some embodiments, materials of the first electrodes 82 or the second electrodes 92 include metal materials such as silver, aluminum, copper, and nickel.

In a second aspect, some embodiments of the present disclosure provide a photovoltaic module. The photovoltaic module includes a plurality of solar cell strings.

Figure 3:
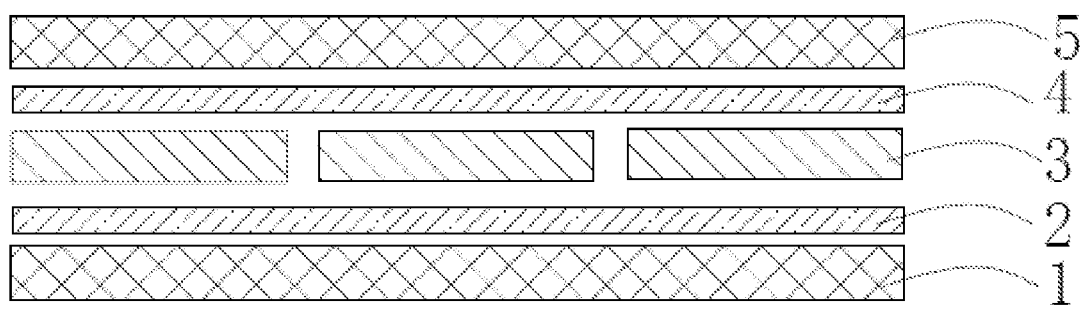
FIG. 3 is a schematic structural diagram of a photovoltaic module according to some embodiments of the present disclosure.

As shown in FIG. 3, the photovoltaic module includes a first cover plate 1, a first packaging adhesive layer 2, a solar cell string 3, a second packaging adhesive layer 4, and a second cover plate 5.

The solar cell string 3 includes a plurality of solar cells (the solar cells as shown in FIG. 1). The solar cells are connected through conductive strips (not shown). The solar cells may be connected by partial stacking or by splicing.

The first cover plate 1 and the second cover plate 5 may be transparent or opaque cover plates, such as glass cover plates or plastic cover plates.

Two sides of the first packaging adhesive layer 2 contact and fit the first cover plate 1 and the solar cell string 3, respectively, and two sides of the second packaging adhesive layer 4 contact and fit the second cover plate 5 and the solar cell string 3, respectively. The first packaging adhesive layer 2 and the second packaging adhesive layer 4 may be an ethylene-vinyl acetate copolymer (EVA) adhesive film, a polyethylene octene co-elastomer (POE) adhesive film, or a polyethylene terephthalate (PET) adhesive film.

Side edges of the photovoltaic module may also be completely packaged. That is, the side edges of the photovoltaic module are fully packaged with a packaging adhesive tape to prevent lamination deviation during the lamination of the photovoltaic module.

Further, the photovoltaic module further includes an edge sealing member. The edge sealing member is fixedly packaged to part of an edge of the photovoltaic module. The edge sealing member may be fixedly packaged to an edge near a corner of the photovoltaic module. The edge sealing member may be a high-temperature resistant tape. The high-temperature resistant tape has excellent high-temperature resistance and may not decompose or fall off during the lamination, which can ensure the reliable packaging of the photovoltaic module. Two ends of the high-temperature resistant tape are fixed to the second cover plate 5 and the first cover plate 1, respectively. The two ends of the high-temperature resistant tape may be bonded to the second cover plate 5 and the first cover plate 1, respectively, and the middle thereof can limit the side edge of the photovoltaic module to prevent lamination deviation of the photovoltaic module during the lamination.

Figure 4:
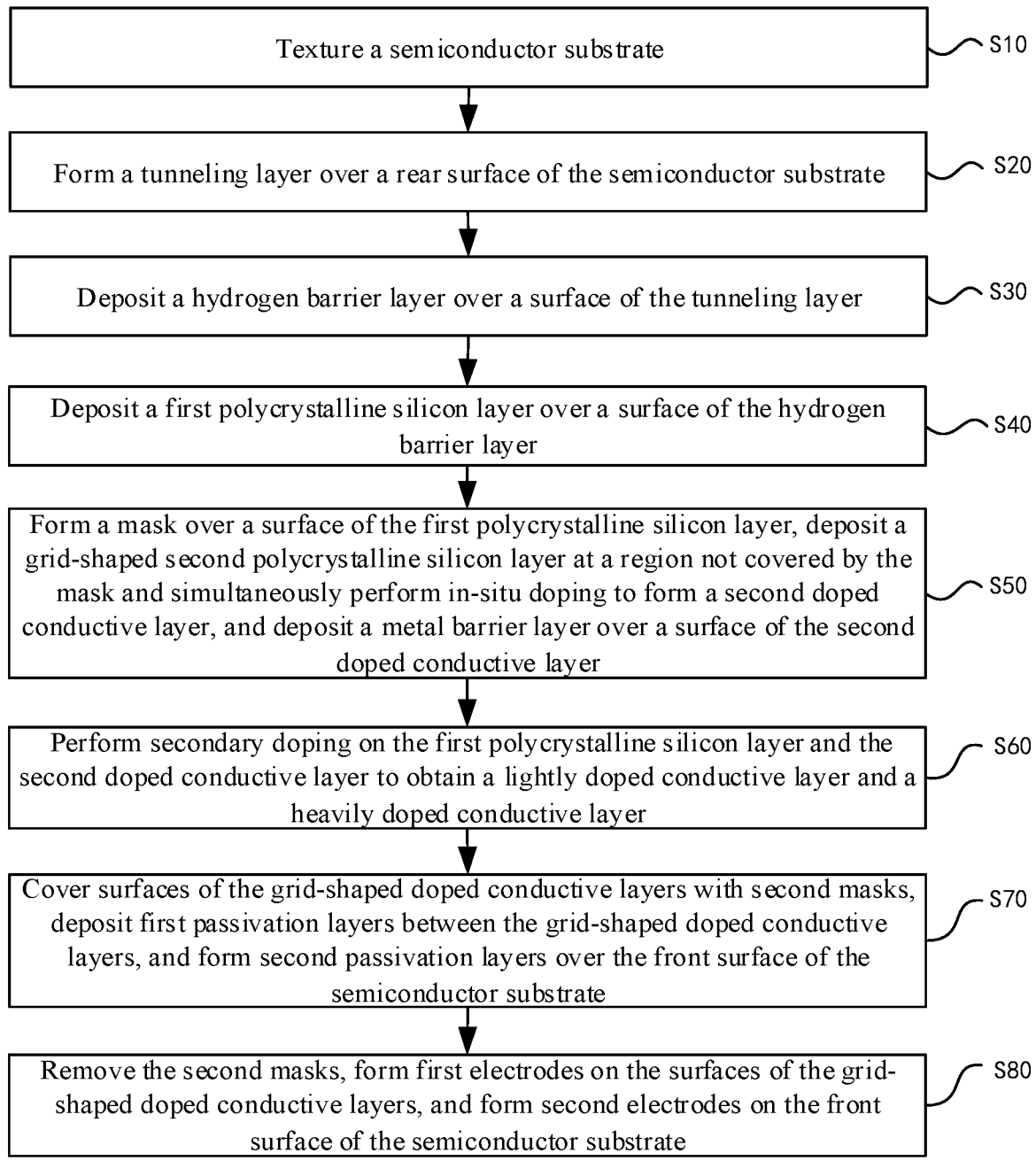
FIG. 4 is a schematic flowchart of a method for manufacturing solar cell according to some embodiments of the present disclosure.

In a third aspect, the present disclosure further provides a method for manufacturing solar cell as described above. As shown in FIG. 4, the method includes the following steps.

In step S10, a semiconductor substrate is textured.

In step S20, a tunneling layer is formed over a rear surface of the semiconductor substrate.

In step S30, a hydrogen barrier layer is deposited over a surface of the tunneling layer.

In step S40, a first polycrystalline silicon layer is deposited over a surface of the hydrogen barrier layer.

In step S50, a mask is formed on a surface of the first polycrystalline silicon layer, a grid-shaped second polycrystalline silicon layer is deposited at a region not covered by the mask and in-situ doping is simultaneously performed to form a second doped conductive layer, and a metal barrier layer is deposited on a surface of the second doped conductive layer.

In step S60, secondary doping is performed on the first polycrystalline silicon layer and the second doped conductive layer to obtain a lightly doped conductive layer and a heavily doped conductive layer.

The solution is introduced below.

In step S10, the semiconductor substrate is textured.

The semiconductor substrate may be a crystalline silicon substrate, for example, one of a polycrystalline silicon substrate, a monocrystalline silicon substrate, a microcrystalline silicon substrate, and a silicon carbide substrate. The specific type of the semiconductor substrate is not limited in the present disclosure. In some embodiments, the N-type semiconductor substrate is an N-type crystalline silicon (or silicon wafer). A thickness of the N-type semiconductor substrate ranges from 60 μm to 240 μm, and may be, for example, 60 μm, 80 μm, 90 μm, 100 μm, 120 μm, 150 μm, 200 μm, 240 μm, or the like, which is not limited herein. Doping elements of the semiconductor substrate may be phosphorus, nitrogen, and the like.

It is to be noted that the specific operation manner of the texturing is not limited in the present disclosure. For example, the N-type substrate may be textured by, but not limited to, a wet texturing process. When the N-type semiconductor substrate is an N-type monocrystalline silicon substrate, an alkaline solution such as a potassium hydroxide solution may be used for texturing.

The texturing process may be performed by chemical etching, laser etching, a mechanical method, plasma etching, or the like. The textured structure enables better filling in the textured structure when metal paste is screen-printed to form electrodes, thereby obtaining better electrode contact, which can effectively reduce series resistance of the solar cell and increase a fill factor.

Prior to step S20, the method further includes: doping a front surface of the textured semiconductor substrate to form a doped layer.

In one or more embodiments, when the semiconductor substrate 10 is an N-type substrate, a P-type doped layer may be formed on the front surface of the semiconductor substrate by using any one or more processes of high-temperature diffusion, paste doping, and ion implantation, so as to form a PN junction in the semiconductor substrate 10.

In some embodiments, the P-type doped layer is a boron-doped diffusion layer. The boron-doped diffusion layer is a P-type doped layer (that is, a P+ layer) formed by using a boron source to diffuse boron atoms to a certain depth on the front surface through a diffusion process. For example, the boron source may be liquid boron tribromide. A microcrystalline silicon phase of the substrate treated with boron diffusion is transformed into a polycrystalline silicon phase. Due to high concentration of boron on the surface of the semiconductor substrate, a layer of borosilicate glass (BSG) is generally formed.

In step S20, the tunneling layer is formed on the rear surface of the semiconductor substrate.

In some feasible embodiments, the rear surface of the semiconductor substrate may be etched by ozone oxidation, high-temperature thermal oxidation, nitric acid oxidation, chemical vapor deposition, or low-pressure chemical vapor deposition for to form the tunneling layer 20.

In some embodiments, the tunneling layer 20 is deposited on the rear surface of the semiconductor substrate by using a temperature-variable process and chemical vapor deposition. During the deposition, a heating rate is controlled to range from 0.5° C./min to 3° C./min, a deposition temperature ranges from 560° C. to 620° C., and deposition time ranges from 3 min to 10 min.

For example, during the deposition, the deposition temperature may be 560° C., 570° C., 580° C., 590° C., 600° C., 610° C., 615° C., 620° C., or the like, the deposition time may be 3 min, 4 min, 5 min, 6 min, 7 min, 8 min, 9 min, 10 min, or the like, and the heating rate may be 0.5° C./min, 0.8° C./min, 1.0° C./min, 1.2° C./min, 1.5° C./min, 2.0° C./min, 2.5° C./min, 3° C./min, or the like, which may also be other values in the above ranges and are not limited herein.

In some embodiments, the tunneling layer 20 is deposited on the rear surface of the semiconductor substrate by low-pressure chemical vapor deposition, which can reduce the influence of excessive local doping concentration of the thin tunneling layer 20 during subsequent high-temperature doping, and reduce fluctuation of the open-circuit voltage. The tunneling layer 20 is deposited by a temperature-variable process and low-pressure chemical vapor deposition.

The tunneling layer 20 may be a stacked structure of one or more of a silicon oxide layer, an aluminum oxide layer, a silicon oxynitride layer, a molybdenum oxide layer, and a hafnium oxide layer. In other embodiments, the tunneling layer 20 may also be an oxygen-containing silicon nitride layer, an oxygen-containing silicon carbide layer, or the like. A thickness of the tunneling layer 20 ranges from 0.8 nm to 2.5 nm.

In step S30, the hydrogen barrier layer 30 is deposited on the surface of the tunneling layer 20.

For example, the hydrogen barrier layer 30 is deposited on the surface of the tunneling layer 20, and the hydrogen barrier layer 30 is made of an oxide with a high dielectric constant. For example, the hydrogen barrier layer 30 includes at least one of a silicon oxynitride layer, a hafnium oxide layer, and a tantalum oxide layer. The arrangement of the hydrogen barrier layer 30 can prevent outward diffusion of hydrogen in the semiconductor substrate during the annealing, increase concentration of the hydrogen at the interface of the tunneling layer after the annealing, prevent overflowing of the hydrogen to the hydrogen-doped conductive layer or the grid-shaped doped conductive layer, and thus improve the passivation effect.

A thickness of the hydrogen barrier layer 30 ranges from 0.2 nm to 1 nm. For example, the thickness of the hydrogen barrier layer 30 is 0.2 nm, 0.3 nm, 0.35 nm, 0.4 nm, 0.5 nm, 0.7 nm, 0.9 nm, 1.0 nm, or the like, which may also be other values in the above range. The thickness is controlled within the above range, which can meet an effect of preventing diffusion of the hydrogen without affecting the tunneling of the electrons.

A dielectric constant of the hydrogen barrier layer 30 ranges from 4.0 to 28. For example, the dielectric constant of the hydrogen barrier layer 30 is 4.0, 5, 6, 6.5, 7, 9, 10, 25, or the like, which may also be other values in the above range. When the dielectric constant is extremely high, insulation conductivity of the hydrogen barrier layer 30 may deteriorate.

A refractive index of the hydrogen barrier layer 30 ranges from 1.6 to 2.6. For example, the refractive index of the hydrogen barrier layer 30 is 1.6, 1.8, 1.9, 2.1, 2.2, 2.4, 2.6, or the like, which may also be other values in the above range.

When the hydrogen barrier layer is made of silicon oxynitride, plasma enhanced chemical vapor deposition may be performed by using mixed gas of ammonia, nitrogen dioxide, and silicane as a gas source, and the deposition temperature is controlled to be in a range of 450° C. to 600° C. In other embodiments, the hydrogen barrier layer may also be formed by low pressure chemical vapor deposition or physical vapor deposition.

In step S40, the first polycrystalline silicon layer is deposited on the surface of the hydrogen barrier layer.

In some embodiments, the first polycrystalline silicon layer is deposited on the surface of the hydrogen barrier layer by any method of physical vapor deposition, chemical vapor deposition, plasma enhanced chemical vapor deposition, and atomic layer deposition. The chemical vapor deposition may be low-pressure chemical vapor deposition or atmospheric pressure chemical vapor deposition.

In some embodiments, plasma enhanced chemical vapor deposition may be performed by using silicane as a gas source, and the deposition temperature is controlled to be in a range of 490° C. to 560° C. In other embodiments, low-pressure chemical vapor deposition or physical vapor deposition may also be performed by using silicane as a gas source to form the first polycrystalline silicon layer, and the deposition temperature is controlled to be in a range of 590° C. to 640° C.

In some embodiments, a deposition thickness of the first polycrystalline silicon layer ranges from 40 nm to 110 nm.

In step S50, the mask is formed on the surface of the first polycrystalline silicon layer, the grid-shaped second polycrystalline silicon layer is deposited in the region not covered by the mask and in-situ doping is simultaneously performed to form the second doped conductive layer, and the metal barrier layer is deposited on the surface of the second doped conductive layer.

In some embodiments, the grid-shaped second polycrystalline silicon layer is deposited in the region not covered by the mask on the surface of the first polycrystalline silicon layer by any method of physical vapor deposition, chemical vapor deposition, plasma enhanced chemical vapor deposition, and atomic layer deposition, and in-situ doping is simultaneously performed to form the second doped conductive layer.

In one or more embodiments, both the deposition of the grid-shaped second polycrystalline silicon layer and the in-situ doping of the grid-shaped second polycrystalline silicon layer are formed in a low-pressure chemical vapor deposition device.

In some embodiments, as shown in FIG. 1, a width D of the grid-shaped second polycrystalline silicon layer ranges from 70 μm to 110 μm. The value of the width may be, for example, 70 μm, 75 μm, 80 μm, 85 μm, 90 μm, 95 μm, 100 μm, 110 μm, or the like, which may also be other values in the above range.

Further, the metal barrier layer 60 is deposited on the surface of the grid-shaped second polycrystalline silicon layer after in-situ doping. It may be understood that, when the solar cell is metallized to form electrodes, it easily causes local damages or erosion to the heavily doped conductive layer. The greater a depth of the erosion, the lower the open-circuit voltage of the solar cell. Moreover, an extremely thick heavily doped conductive layer may bring parasitic light absorption, resulting in decrease in the short-circuit current and decrease in the bifacial rate of the solar cell. Through the arrangement of the metal barrier layer, intrusion of the metal electrodes into the heavily doped conductive layer can be prevented, and the thickness of the entire solar cell can be reduced, thereby enhancing the photoelectric conversion efficiency.

In some embodiments, the metal barrier layer 60 is made of a material with a high melting point and no negative charge. The metal barrier layer 60 includes at least one of M nitride, M oxide, M carbide, M oxynitride, M metal, silicon carbide, and silicon nitride. M is selected from at least one of Ti, Al, Ta, Cr, Ca, Mo, V, Zr, and W.

For example, the metal barrier layer includes at least one of a tantalum nitride layer, a titanium nitride layer, a titanium carbide layer, a tungsten carbide layer, and a silicon carbide layer. In an example, tantalum nitride has a melting point of 3090° C. and resistivity of 128 μΩ·cm; titanium nitride has a melting point of 2950° C. and resistivity of 22 μΩ·cm; titanium carbide has a melting point of 3140° C. and resistivity of 60 μΩ·cm. In consideration of convenience of a manufacturing process and manufacturing costs, in some embodiments, the metal barrier layer is a silicon carbide layer, and a mass content of carbon in silicon carbide is less than 20%.

When the metal barrier layer is made of tantalum nitride, titanium nitride, or metal, the metal barrier layer may be manufactured and formed by magnetron sputtering, and metal titanium and tantalum in the metal barrier layer may be in contact with silicon to form low-resistance ohmic contact.

When the metal barrier layer is made of an M carbide, such as a calcium carbide, a chromium carbide, a tantalum carbide, a vanadium carbide, a zirconium carbide, or a tungsten carbide, the metal barrier layer may also be manufactured and formed by magnetron sputtering.

In some embodiments, the metal barrier layer 60 is a laminated structure of a titanium aluminum oxide layer and a titanium oxide layer. The laminated structure can have low manufacturing costs and ensure an anti-erosion effect of the metal barrier layer. During actual manufacturing, the metal barrier layer may be manufactured by atomic layer deposition.

In some embodiments, a thickness of the metal barrier layer 60 ranges from 1 nm to 5 nm, which may be, for example, 1 nm, 2 nm, 3 nm, 4 nm, 5 nm, or the like, and may also be other values in the above range.

In some embodiments, resistivity of the metal barrier layer 60 is less than 1.5 mΩ·cm, which may be, for example, 1.45 mΩ·cm, 1.3 mΩ·cm, 1.25 mΩ·cm, 1.15 mΩ·cm, 1.1 mΩ·cm, 1.0 mΩ·cm, 0.8 mΩ·cm, or the like, and may also be other values in the above range. That is, a conductivity of the metal barrier layer is better than the heavily doped conductive layer (heavily doped polycrystalline silicon layer), which can improve contact and increase the fill factor of the solar cell.

A total thickness H of the grid-shaped doped conductive layer ranges from 20 nm to 50 nm. The total thickness may be, for example, 20 nm, 25 nm, 30 nm, 35 nm, 40 nm, 45 nm, 50 nm, or the like, which may also be other values in the above range, only provided that the total thickness H of the grid-shaped doped conductive layer is controlled within the above range.

In step S60, secondary doping is performed on the first polycrystalline silicon layer and the second doped conductive layer to obtain the lightly doped conductive layer and the heavily doped conductive layer.

It may be understood that, after the mask is removed, the first polycrystalline silicon layer is doped to form the lightly doped conductive layer, while the second doped conductive layer is subjected to secondary doping to form the heavily doped conductive layer, and at the same time, part of doping elements in a heavily doped conductive region and a lightly doped conductive region diffuse into the hydrogen barrier layer.

Subsequent to step S60 and prior to step S70, the above method further includes: performing high-temperature annealing and cleaning after the secondary doping.

Specific operation manners of the high-temperature annealing and the cleaning are not limited in the embodiments of the present disclosure. In an example, the high-temperature annealing deals with the deposited polycrystalline silicon layer, which enables the polycrystalline silicon layer to be better crystallized, and an annealing temperature may range from 700° C. to 1000° C.

Through the high-temperature annealing, pentavalent phosphorus atoms are diffused to form a doped conductive layer. After the annealing, a silicon phase of crystalline silicon is transformed into a polycrystalline silicon phase, and phosphorus is deposited on the surface of the semiconductor substrate to form phosphosilicate glass (PSG). Degrees of crystallization of the lightly doped conductive layer 40 and the heavily doped conductive layer 50 are greater than 70%. A high degree of crystallization means few defects in crystal in the conductive layer and good photoelectric properties, which can improve the photoelectric conversion efficiency of the solar cell. In some embodiments, the degree of crystallization of the lightly doped conductive layer is greater than 88%, and the degree of crystallization of the heavily doped conductive layer 50 is greater than 80%.

The cleaning is to remove the PSG formed during the doping. It may be understood that, when phosphorus diffuses, due to high concentration of the phosphorus on the surface of the semiconductor substrate, a PSG layer may be generally formed. The PSG layer has a metal gettering effect, which may affect normal operation of the solar cell and is required to be removed.

For example, the PSG layer may be removed by pickling. It is to be noted that washing is required after the pickling, washing time ranges from 10 s to 20 s, and a washing temperature may range from 15° C. to 25° C. The semiconductor substrate may also be dried after the washing.

In step S70, second masks cover surfaces of the grid-shaped doped conductive layers, and first passivation layers are deposited between the grid-shaped doped conductive layers; and second passivation layers are formed on the front surface of the semiconductor substrate.

In some embodiments, the first passivation layers and the second passivation layers may be deposited by plasma-enhanced chemical vapor deposition, and may also be deposited with other methods, such as organic chemical vapor deposition. Specific implementation manners of the first passivation layers and the second passivation layers are not limited in the present disclosure. The above passivation layers can bring good passivation effect on the semiconductor substrate, which helps to improve the conversion efficiency of the solar cell.

In step S80, the second masks are removed, first electrodes are formed on the surfaces of the grid-shaped doped conductive layers, and second electrodes are formed on the front surface of the semiconductor substrate.

In some embodiments, the first electrodes and the second electrodes may be formed by sintering metal conductive paste applied to surfaces of the first passivation layers and the second passivation layers. Materials of the first electrodes or the second electrodes include metal materials such as silver, aluminum, copper, and nickel. The second electrodes form ohmic contact with the P-type doped layer (e.g., the boron-doped diffusion layer) on the front surface of the semiconductor substrate, and the first electrodes form ohmic contact with the grid-shaped doped conductive layers.

As shown in FIG. 2, in the solar cell required to be manufactured, the first passivation layers 81 are located between the grid-shaped doped conductive layers and on surfaces of the grid-shaped doped conductive layers, and the first electrodes 82 penetrate the first passivation layers 81 to form ohmic contact with at least part of the grid-shaped doped conductive layers. The manufacturing process thereof is different from the above steps in the following.

In step S70, the first passivation layers are deposited on the surfaces of the grid-shaped doped conductive layers. In this case, the first passivation layers 81 are located between the grid-shaped doped conductive layers and on the surfaces of the grid-shaped doped conductive layers. Moreover, the second passivation layers are formed on the front surface of the semiconductor substrate.

In step S80, the first electrodes are formed on surfaces of the first passivation layers, and the second electrodes are formed on the front surface of the semiconductor substrate. The first electrodes 82 penetrate the first passivation layers 81 to form ohmic contact with at least part of the grid-shaped doped conductive layers. Details are not described herein again.

A specification M10 is selected for a size of a silicon wafer substrate, with a side length generally ranging from 182 mm to 182.3 mm, and Embodiments 1 to 7 of solar cells manufactured according to the above method are obtained. Part of the parameters of the structure of the solar cell are shown in Table 1.

The grid-shaped doped conductive layer in Embodiments 1 to 6 includes a heavily doped conductive layer and a metal barrier layer that are stacked, and the grid-shaped doped conductive layer in Embodiment 7 further includes a third doped conductive layer located on a surface of the metal barrier layer.

A tunneling layer, a grid-shaped doped conductive layer located on a surface of the tunneling layer, a first passivation layer, and a first electrode are sequentially stacked on the rear surface of the solar cell in Comparative Example 1. The grid-shaped doped conductive layer includes a heavily doped conductive layer and a metal barrier layer that are stacked on one another.

A tunneling layer, a hydrogen barrier layer, a grid-shaped doped conductive layer located on a surface of the hydrogen barrier layer, a first passivation layer, and a first electrode are sequentially stacked on the rear surface of the solar cell in Comparative Example 2. The grid-shaped doped conductive layer is a heavily doped conductive layer.

Figure 5:
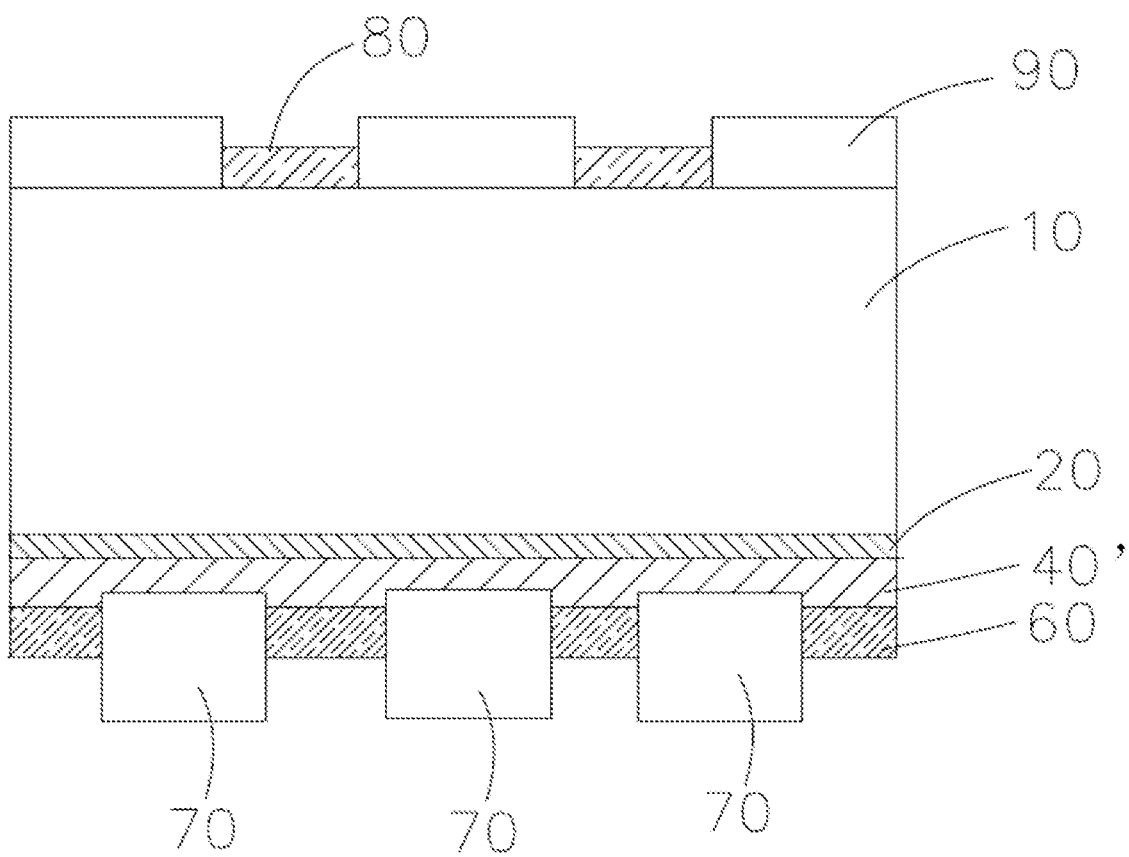
FIG. 5 is a schematic structural diagram of a solar cell according to Comparative Example 3.

The solar cell in Comparative Example 3 is conventional TOPCon, with a structure as shown in FIG. 5. On the surface of the tunneling layer 20 is a doped conductive layer 40', doping concentration of which is the same as the lightly doped conductive region in Embodiment 1.

TABLE 1

Parameters of the solar cell

| | Hydrogen barrier layer | | Grid-shaped doped conductive layer | | | |
|---|---|---|---|---|---|---|
| Sample | Thickness (nm) | Material | Width D (μm) | Thickness (nm) of the heavily doped conductive layer | Thickness (nm) of the metal barrier layer | Material of the metal barrier layer |
| Embodiment 1 | 0.5 | Silicon oxynitride | 100 | 40 | 2 | Silicon carbide |
| Embodiment 2 | 0.5 | Hafnium oxide | 100 | 40 | 2 | Silicon carbide |
| Embodiment 3 | 0.5 | Tantalum oxide | 100 | 40 | 2 | Silicon carbide |
| Embodiment 4 | 0.5 | Silicon oxynitride | 100 | 40 | 2 | Tantalum nitride |
| Embodiment 5 | 0.5 | Silicon oxynitride | 100 | 40 | 2 | Titanium nitride |
| Embodiment 6 | 0.5 | Silicon oxynitride | 100 | 40 | 2 | Titanium aluminum oxide and titanium oxide |
| Embodiment 7 | 0.2 | Silicon oxynitride | 100 | 45 | 3 | Silicon carbide |
| Embodiment 8 | 0.6 | Silicon oxynitride | 100 | 40 | 5 | Silicon carbide |
| Comparative | / | / | 100 | 40 | 2 | Silicon |

TABLE 1-continued

Parameters of the solar cell

| | Hydrogen barrier layer | | Grid-shaped doped conductive layer | | | |
|---|---|---|---|---|---|---|
| Sample | Thickness (nm) | Material | Width D (μm) | Thickness (nm) of the heavily doped conductive layer | Thickness (nm) of the metal barrier layer | Material of the metal barrier layer |
| Example 1 | | | | | | carbide |
| Comparative Example 2 | 0.5 | Silicon oxynitride | 100 | 40 | / | / |
| Comparative Example 3 | / | / | / | / | / | / |

Test results of the manufactured solar cell are shown in Table 2 below.

TABLE 2

Test results of the solar cell

| Sample | Open-circuit voltage (mV) | Short-circuit current (A) | Fill factor | Photoelectric conversion efficiency (%) |
|---|---|---|---|---|
| Embodiment 1 | 722 | 13.77 | 83.65 | 25.1967 |
| Embodiment 2 | 723 | 13.78 | 83.80 | 25.2419 |
| Embodiment 3 | 725 | 13.78 | 83.80 | 25.3468 |
| Embodiment 4 | 725 | 13.78 | 84.00 | 25.4073 |
| Embodiment 5 | 725 | 13.78 | 84.20 | 25.4678 |
| Embodiment 6 | 726 | 13.78 | 84.00 | 25.4073 |
| Embodiment 7 | 725 | 13.78 | 83.80 | 25.3468 |
| Comparative Example 1 | 721 | 13.75 | 83.62 | 25.1492 |
| Comparative Example 2 | 721 | 13.74 | 83.63 | 25.0540 |
| Comparative Example 3 | 721 | 13.73 | 83.60 | 25.0168 |

As can be seen from the test results of Embodiments 1 to 7, under a synergistic effect of the selective passivation contact structure, the hydrogen barrier layer, and the metal barrier layer, the TOPCon solar cell can improve fill factor efficiency and solar energy conversion efficiency compared with the ordinary TOPCon cells. Moreover, the hydrogen barrier layer is arranged between the tunneling layer and the doped conductive layer to use the hydrogen barrier layer to prevent overflowing of hydrogen during annealing, which increases hydrogen concentration at an interface of the tunneling layer after annealing and improves a passivation effect. The heavily doped conductive layer and the metal barrier layer that are stacked are constructed on the grid-shaped doped conductive layer, and the metal barrier layer can prevent erosion of the heavily doped conductive layer by metal electrodes and can also reduce the thickness of the passivated polycrystalline silicon layer of the entire solar cell, thereby enhancing light absorption of the solar cell.

The solar cell manufactured in Embodiment 1 is not provided with the hydrogen barrier layer, which slightly affects the tunneling effect of the tunneling layer and affects all the open-circuit voltage, the fill factor, and the solar conversion efficiency of the solar cell.

In the solar cell manufactured in Embodiment 2, no metal barrier layer is arranged on the surface of the heavily doped conductive layer, and the metal electrode erodes the heavily doped conductive layer, which affects all the open-circuit voltage, the fill factor, and the solar conversion efficiency of the solar cell.

Comparative Example 3 relates to a conventional TOPCon cell, and overall performance of the solar cell is inferior to the data in Examples 1-7.

Although the present disclosure is disclosed as above with preferred embodiments, such embodiments are not intended to limit the claims. Any person skilled in the art can make some possible changes and modifications without departing from the concept of the present disclosure. Therefore, the protection scope of the present disclosure should be based on the scope defined by the claims of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A solar cell, comprising:
    a semiconductor substrate;
    a tunneling layer located over a rear surface of the semiconductor substrate;
    a hydrogen barrier layer located over a surface of the tunneling layer away from the semiconductor substrate;
    a lightly doped conductive layer located over a surface of the hydrogen barrier layer away from the semiconductor substrate;
    grid-shaped doped conductive layers located on at least part of a surface of the lightly doped conductive layer away from the semiconductor substrate, wherein each of the grid-shaped doped conductive layers includes a heavily doped conductive layer and a metal barrier layer that are stacked on one another;
    first passivation layers located between the grid-shaped doped conductive layers; and
    first electrodes configured to form ohmic contact with at least part of the grid-shaped doped conductive layers, wherein in each of the grid-shaped doped conductive layers, the metal barrier layer is located on a surface of the heavily doped conductive layer away from the semiconductor substrate.

2. The solar cell according to claim 1, wherein each of the grid-shaped doped conductive layers further includes a third doped conductive layer located at a surface of the metal barrier layer.

3. The solar cell according to claim 1, wherein the hydrogen barrier layer includes at least one of a silicon oxynitride layer, a hafnium oxide layer, or a tantalum oxide layer.

4. The solar cell according to claim 3, wherein the hydrogen barrier layer has a thickness ranging from 0.2 nm to 1 nm.

5. The solar cell according to claim 3, wherein the hydrogen barrier layer has a dielectric constant ranging from 4.0 to 28.

6. The solar cell according to claim 3, wherein the hydrogen barrier layer has a refractive index ranging from 1.6 to 2.6.

7. The solar cell according to claim 1, wherein each metal barrier layer comprises at least one of M nitride, M oxide, M carbide, M oxynitride, M metal, silicon carbide, and silicon nitride, wherein M is selected from at least one of Ti, Al, Ta, Cr, Ca, Mo, V, Zr, or W.

8. The solar cell according to claim 1, wherein each metal barrier layer comprises at least one of a tantalum nitride layer, a titanium nitride layer, a titanium carbide layer, a tungsten carbide layer, a titanium aluminum oxide layer, or a silicon carbide layer.

9. The solar cell according to claim 1, wherein each metal barrier layer is a laminated structure of a titanium aluminum oxide layer and a titanium oxide layer.

10. The solar cell according to claim 1, wherein each metal barrier layer has a thickness ranging from 0.5 nm to 5 nm.

11. The solar cell according to claim 1, wherein each metal barrier layer has a resistivity less than 1.5 mΩ·cm.

12. The solar cell according to claim 1, wherein the lightly doped conductive layer has a doping concentration ranging from 0.8 E20 $cm^{-3}$ to 4 E20 $cm^{-3}$, and each heavily doped conductive layer has a doping concentration ranging from 4 E20 $cm^{-3}$ to 2 E21 $cm^{-3}$.

13. The solar cell according to claim 1, wherein each heavily doped conductive layer has an optical band gap ranging from 1.4 eV to 1.8 eV.

14. The solar cell according to claim 1, wherein the lightly doped conductive layer and each heavily doped conductive layer each have a degree of crystallization after annealing being greater than 70%.

15. The solar cell according to claim 14, wherein the degree of crystallization of the lightly doped conductive layer is greater than 88%, and the degree of crystallization of each heavily doped conductive layer is greater than 80%.

16. The solar cell according to claim 1, wherein each of the grid-shaped doped conductive layers has a width ranging from 70 μm to 110 μm, and each of the grid-shaped doped conductive layers has a total thickness ranging from 20 nm to 50 nm.

17. The solar cell according to claim 1, wherein:
the first passivation layers are also provided on surfaces of the grid-shaped doped conductive layers, and
the first electrodes penetrate the first passivation layers to form ohmic contact with the grid-shaped doped conductive layers.

18. The solar cell according to claim 2, wherein in each of the grid-shaped doped conductive layers, the third doped conductive layer has a doping concentration greater than the heavily doped conductive layer, and each first electrode penetrates one of the first passivation layers to form ohmic contact with the third doped conductive layer.

19. A method for manufacturing the solar cell of claim 1.

20. A photovoltaic module, comprising a plurality of solar cell strings, wherein each of the solar cell strings comprises a plurality of solar cells, and at least one of the solar cells includes:
a semiconductor substrate;
a tunneling layer located over a rear surface of the semiconductor substrate;
a hydrogen barrier layer located over a surface of the tunneling layer away from the semiconductor substrate;
a lightly doped conductive layer located over a surface of the hydrogen barrier layer away from the semiconductor substrate;
grid-shaped doped conductive layers located on at least part of a surface of the lightly doped conductive layer away from the semiconductor substrate, wherein each of the grid-shaped doped conductive layers includes a heavily doped conductive layer and a metal barrier layer that are stacked on one another;
first passivation layers located between the grid-shaped doped conductive layers; and
first electrodes configured to form ohmic contact with at least part of the grid-shaped doped conductive layers,
wherein in each of the grid-shaped doped conductive layers, the metal barrier layer is located on a surface of the heavily doped conductive layer away from the semiconductor substrate.

* * * * *